United States Patent
Wu

Patent Number: 5,825,258
Date of Patent: Oct. 20, 1998

[54] PHASE-LOCKED LOOP CIRCUIT

[76] Inventor: Ming Chou Wu, No. 1-2, Lane 5, Yuan Te Road, Tan Shui Chen, Taiwan

[21] Appl. No.: 643,873

[22] Filed: May 7, 1996

[51] Int. Cl.⁶ .................................. H03L 7/06; H03B 5/32
[52] U.S. Cl. .............................. 332/127; 331/18; 331/23; 331/158; 331/177 V
[58] Field of Search ..................................... 332/127, 128; 331/18, 23, 116 R, 116 FE, 158, 177 V

[56] References Cited

U.S. PATENT DOCUMENTS

| | | | |
|---|---|---|---|
| 3,622,913 | 11/1971 | Shipley | 332/128 |
| 5,423,075 | 6/1995 | Boese et al. | 332/127 X |

*Primary Examiner*—David Mis
*Attorney, Agent, or Firm*—Morton J. Rosenberg; David I. Klein; Jun Y. Lee

[57] ABSTRACT

An improvement on the phase-locked loop (PLL) circuit, in which an amplifier is disposed at the modulating signal input end of the PLL, and the output end of the amplifier is connected in series to a resistor and an inductor, followed by a resistor connected to a higher DC bias as well as a variable capacitance diode connected to ground. In such a way, the variable capacitance diode is under the higher bias and thus has a smaller capacitance change, while having its Q-value property opposite to the resonance curve formed by the crystal unit of an oscillator which is associated in parallel with the variable capacitance diode, thereby forming in a good compensation for the linearity of the circuit architecture and achieving an ideal frequency deviation and a reduced distortion caused by the modulation.

7 Claims, 1 Drawing Sheet

PHASE-LOCKED LOOP CIRCUIT

FIELD OF THE INVENTION

The present invention is related to an improvement on the phase-locked loop (PLL) circuit.

BACKGROUND OF THE INVENTION

Due to advance in science and technology, the levels of relevant products are continuously being raised. In particular, those in radio communication have much more improvements, where higher and higher frequencies from VHF to UHF have been used. In general, the point of radio communication mainly resides in how to exactly make a baseband signal modulated on a high frequency carrier and transmit the modulated signal, i.e. the so-called transmitting end. In ways of the modulation at the transmitting end, problems of frequency deviation, frequency drift, frequency drift caused by temperature variation, etc. are becoming increasingly complicated with raised frequencies. Most of the currently known ways of modulation for audio baseband frequencies pertain to frequency modulation (FM). A common way for FM is to use a variable capacitance diode which capacitance value is altered so as to deviate the carrier frequency formed by an associated oscillator, thereby achieving the purpose of FM. However, normally, in high frequencies, especially the ISM (Industrial, Scientific and Medical) BAND at 900 MHZ, some problems may be produced:

1. The carrier frequency is easy to drift. This drawback can be removed by use of a ceramic resonator or a quartz resonator, in which the quartz resonator has a feature of frequency drift smaller than the ceramic resonator.

2. A common telephone system has a frequency deviation of only more than 10 KHZ for modulation because of its transmission of a speaking bandwidth. However, for the transmission of a stero baseband, it is necessary to have a sufficient frequency deviation of 75 KHZ. Normally, if without subcarrier (SCA), a frequency deviation of only more than 50 KHZ is enough.

It is realized from the above that in the transmission of an audio baseband, it may be a practicable optimum way to make the modulation have a frequency deviation of at-least more than 50 KHZ and to adopt the quartz resonator to maintain a minimum frequency drift. In fact, however, the quartz resonator can not reach a frequency deviation of more than 50 KHZ but mere 2–3 KHZ. As a result, another way, i.e. the phase-locked loop, is commonly employed, which adds a modulating signal to a voltage-controlled oscillator to form frequency deviation. Nonetheless, since the loop is subject to the lock-on time and hold-in range, etc., its low frequency response normally fails to reach an ideal range low enough, and it is not easy to obtain a frequency deviation of more than 50 KHZ. Further, if preemphasis is added when transmitting, its resultant frequency deviation will be expanded, thereby aggravating the above situation.

SUMMARY OF THE INVENTION

The present invention is to provide an improvement on the PLL circuit, in which an amplifier is disposed at the modulating signal input end of the PLL, and the output end of the amplifier is connected in series to a resistor and an inductor, followed by a resistor connected to a higher DC bias as well as a variable capacitance diode connected to ground. In such a way, the variable capacitance diode is under the higher bias and thus has a smaller capacitance change, while having its Q-value property opposite to the resonance curve formed by the crystal unit of an oscillator which is associated in parallel with the variable capacitance diode, thereby forming a good compensation for the linearity of the loop architecture.

The present invention mainly achieves an idea 1 frequency deviation and a reduced distortion caused by the modulation when obtaining a good compensation for the linearity of the loop architecture.

The present invention, due to its frequency modulation at the reference frequency end, also has a low frequency property without the disadvantage of producing a bad low frequency response as that resulting from the modulation at VCO (Voltage-Controlled Oscillator) or CCO (Current-controlled Oscillator) end which is subject to the lock-on time/hold-in range properties of the PLL.

BRIEF DESCRIPTION OF THE DRAWINGS

The FIGURE is the circuit diagram of a preferred embodiment the present invention.

DETAILED DESCRIPTION OF THE PREFERRED EMBODIMENT

Figure 1:
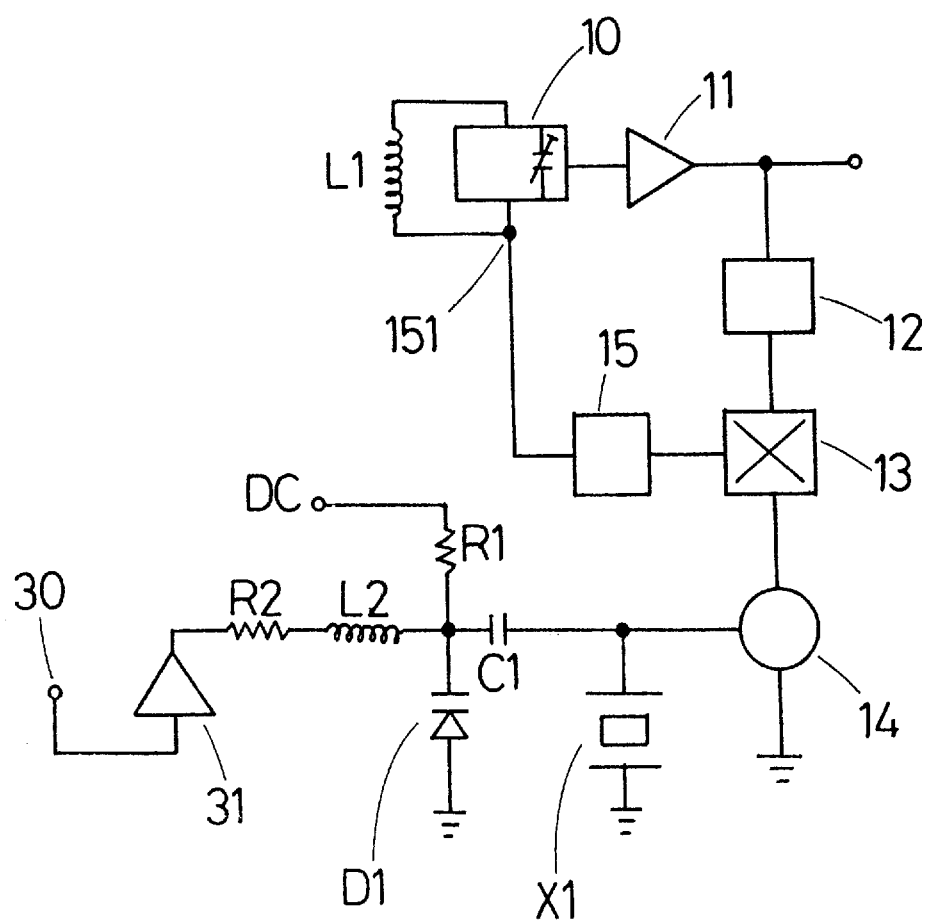

Referring to the FIGURE, it shows a phase-locked loop, where the capacitance provided by the VCO (CCO) 10 is in parallel with L1 to form a resonant frequency. The resonant frequency is properly amplified by the amplifier 11. Then, the amplified frequency is divided by N through the frequency divider 12, and the divided frequency is fed into the phase detector 13 for phase comparison with the reference frequency 14. The compared result at the output of the phase detector 13 is a level signal which is transferred through the low pass filter 15 to the control input 151 of the VCO (CCO) 10, so as to change the capacitance of the VCO (CCO) 10 and further change the resonant frequency and the phase, thereby achieving the purpose of phase lock.

It is realized from the above circuit operation that if the reference frequency 14 takes a frequency deviation of 3 KHZ, the resonant frequency forms a 3 KHZ×N deviation. Thus, the quartz unit can be served as a reference frequency to generate a stable output frequency with small frequency deviation. However, in practical design, if the signal and DC bias are not large enough and the selected-variable capacitance diode is improper, it is difficult to have the reference frequency oscillator use the quartz unit to form the frequency deviation of 3 KHZ while maintaining a smaller distortion. Maybe common variable capacitance diodes, according to relevant specifications, can have a capacitance change of 1–2p with a voltage variation only less than 1 volt. In actual loop applications, however, because the variable capacitance diode has its capacitance change curve subject to the high Q-value and low bandwidth properties of the quartz unit, it is impossible from the above capacitance change of 1–2p to obtain a frequency deviation having good linearity and low distortion, and thus it is impossible at a relevant receiver through demodulation to produce a baseband signal having low distortion, making the high-fidelity transmission ineffective.

In view of the above, the circuit of the present invention is particularily provided with the variable capacitance diode D1 which is coupled with the quartz unit X1 through the capacitor C1 and is connected in parallel with the combination of C1 and X1 in series to ground. The other end of the variable capacitance diode D1 is connected to a higher DC bias through the resistor R1, and thus the variable capacitance diode has a smaller capacitance change, while having its Q-value property opposite to the resonance curve formed by the quartz unit X1 of the oscillator which is combined with the variable capacitance diode, thereby forming a good compensation for the linearity of the whole circuit architecture and achieving an ideal frequency deviation and a reduced distortion caused by the modulation. Meanwhile, since the frequency modulation is effected at the reference frequency 14 end, the low frequency property of the present invention will not have a bad low frequency response as that resulting from the modulation at VCO (CCO) end which is subject to the lock-on time and hold-in range and other properties of the PLL. However, the variable capacitance diode D1 biased at the higher DC bias will cause its capacitance sensitivity relative to the external bias to decrease. Therefore, the amplifier 31 is added to the modulating signal input end 30 to amplify the external modulating signal, and then the amplified signal is transferred to the variable capacitance diode D1 through the serial connection of R2 and L2 for the modulation of the baseband deviation.

What is claimed is:

1. A phase locked loop circuit comprising:
   (a) an oscillator adapted for generating responsive to a predetermined control signal a first signal having a resonant frequency;
   (b) a frequency divider electrically coupled to said oscillator for dividing said resonant frequency of said first signal to generate a second signal;
   (c) means for generating a predetermined reference frequency signal;
   (d) a phase detector electrically coupled to said frequency divider and said means for generating said reference frequency signal for comparing the phase of said second signal with the phase of said predetermined reference frequency signal to generate a third signal;
   (e) a low pass filter electrically coupled to said phase detector for filtering said third signal and generating said predetermined control signal for said oscillator; and,
   (f) a modulation subcircuit electrically coupled to said means for generating said reference frequency signal including:
      (1) an amplifier for generating a fourth signal responsive to a predetermined input modulation signal;
      (2) a resonator electrically coupled to said amplifier; and,
      (3) a variable capacitance diode means electrically coupled in parallel to said resonator, said variable capacitance diode means having a predetermined electrical sensitivity parameter determined responsive to an input bias signal, said variable capacitance diode means having a Q-value parameter related in predetermined manner to a parametric resonant frequency curve characteristic of said resonator;
      whereby frequency deviation and signal distortion during operation of said phased locked loop circuit are minimized.

2. The phase locked loop circuit as recited in claim 1 wherein said modulation subcircuit further includes at least a first resistor and a first inductor connected between said amplifier and said variable capacitance diode means.

3. The phase locked loop circuit as recited in claim 2 wherein said modulation subcircuit further includes a second resistor connected to said variable capacitance diode means for the passage of said input bias signal therethrough.

4. The phase locked loop circuit as recited in claim 1 wherein said resonator is a quartz resonator.

5. The phase locked loop circuit as recited in claim 1 wherein said oscillator is a voltage-controlled oscillator.

6. The phase locked loop circuit as recited in claim 1 wherein said oscillator is a current-controlled oscillator.

7. The phase locked loop circuit as recited in claim 1 wherein said modulation subcircuit further includes at least a first capacitor connected between said variable capacitance diode means and said resonator.

* * * * *